(12) United States Patent
Yun et al.

(10) Patent No.: US 11,732,163 B2
(45) Date of Patent: Aug. 22, 2023

(54) ADHESIVE COMPOSITION AND USE THEREOF

(71) Applicant: Shanjin Optoelectronics (Suzhou) Co., Ltd., Jiangsu (CN)

(72) Inventors: Ha Song Yun, Daejeon (KR); Seung Ju Noh, Daejeon (KR); Hyun Hee Son, Daejeon (KR); Kwang Su Seo, Daejeon (KR)

(73) Assignee: Shanjin Optoelectronics (Suzhou) Co., Ltd.

( * ) Notice: Subject to any disclaimer, the term of this patent is extended or adjusted under 35 U.S.C. 154(b) by 288 days.

(21) Appl. No.: 16/959,268

(22) PCT Filed: Jan. 23, 2019

(86) PCT No.: PCT/KR2019/000949
§ 371 (c)(1),
(2) Date: Jun. 30, 2020

(87) PCT Pub. No.: WO2019/147011
PCT Pub. Date: Aug. 1, 2019

(65) Prior Publication Data
US 2020/0332157 A1    Oct. 22, 2020

(30) Foreign Application Priority Data
Jan. 23, 2018  (KR) .......... 10-2018-0008029

(51) Int. Cl.
*C09J 11/06* (2006.01)
*C09J 133/08* (2006.01)
(Continued)

(52) U.S. Cl.
CPC ............ *C09J 11/06* (2013.01); *C09J 133/08* (2013.01); *G02B 5/208* (2013.01); *G02B 5/305* (2013.01);
(Continued)

(58) Field of Classification Search
None
See application file for complete search history.

(56) References Cited

U.S. PATENT DOCUMENTS

2011/0293857 A1* 12/2011 Fukatani .......... B32B 17/10458
                                                          428/1.33
2017/0090217 A1  3/2017 Nahm et al.
2018/0120490 A1* 5/2018 Hwang ............... G09G 3/3225

FOREIGN PATENT DOCUMENTS

JP    09-100392 A  *  4/1997  ............ C08G 59/40
JP    H09100392 A     4/1997
(Continued)

OTHER PUBLICATIONS

Caricato et al., New Journal of Chemistry. 2013, vol. 37, pp. 2792-2799. (Year: 2013).*
(Continued)

*Primary Examiner* — Anthony J Frost

(57) ABSTRACT

A pressure-sensitive adhesive composition and a use thereof are provided. The present application can provide a pressure-sensitive adhesive composition which has excellent performance to block ultraviolet rays including a blue region of 380 nm or more and exhibits excellent durability upon reliability evaluation without deteriorating the optical characteristics of a polarizing plate when applied to the polarizing plate. The pressure-sensitive adhesive composition of the present application can be used, for example, for a polarizing plate and an organic light emitting device.

16 Claims, 2 Drawing Sheets

(51) Int. Cl.
  *G02B 5/20*    (2006.01)
  *G02B 5/30*    (2006.01)
  *H10K 50/86*   (2023.01)
  *H10K 85/60*   (2023.01)
  *H10K 85/10*   (2023.01)
  *C08K 5/18*    (2006.01)
  *C08K 5/3445*  (2006.01)

(52) U.S. Cl.
  CPC ............ *H10K 50/86* (2023.02); *H10K 85/141* (2023.02); *H10K 85/151* (2023.02); *H10K 85/60* (2023.02); *H10K 85/654* (2023.02); *C08K 5/18* (2013.01); *C08K 5/3445* (2013.01)

(56) References Cited

FOREIGN PATENT DOCUMENTS

| | | | | |
|---|---|---|---|---|
| JP | 2006241086 | A | | 9/2006 |
| JP | 2008308620 | A | | 12/2008 |
| KR | 101042477 | B1 | | 6/2011 |
| KR | 20130074667 | A | | 7/2013 |
| KR | 20150045909 | A | | 4/2015 |
| KR | 20160060995 | A | | 5/2016 |
| KR | 10-2017-0033012 | A | * 3/2017 | ............ C09J 11/06 |
| KR | 20170033912 | A | | 3/2017 |

OTHER PUBLICATIONS

ChemSRC, strcuture for compound 1-phenyl-3-(4-t-butylstyryl)-5-(4-t-butylphenyl)pyrazoline, https://www.chemsrc.com/en/baike/1348130.html, accessed Nov. 30, 2022.*

Caricato M, Coluccini C, Vander Griend DA, Forni A, Pasini D. From red to blue shift: Switching the binding affinity from the acceptor to the donor end by increasing the p-bridge in push-pull chromophores with coordinative ends. New Journal of Chemistry, accepted Jun. 20, 2013;37(9):2792-9.

International Search Report for PCT/KR2019/000949 dated Apr. 25, 2019; 3 pages.

Taiwan Search Report for Application No. 108102584, dated Jan. 23, 2018, 1 page.

Hokama, Kozo et al., "Photochemical Oxidation of 1.3.5-triaryll-2-pyrazoline", Bulletin of Science & Engineering Division, University of Ryukyus, issued Mar. 1972, issue 15, pp. 59-65 (Providing English translation of abstract only).

Nozomi Oguchi et al., "Dioctyl 4-Methoxybenzylidenemalonate: A New UV-B Absorber", Journal of Society of Cosmetic Chemists of Japan, Apr. 2013, vol. 47, issue 3, pp. 209-215 (Providing English translation of abstract only).

Yasuo Toi et al., "Synthesis of pyridine derivatives with pyridine ring", Journal of Japan Chemistry, Aug. 1965, vol. 86, No. 12, pp. 1322-1327 (Providing English translation of abstract only).

* cited by examiner

Figure 6

| 403 |
|---|
| 401 |
| 405 |
| 406 |
| 402 |
| 407 |
| 408 |

Figure 7

| 100 |
|---|
| 701 |
| 702 |
| 703 |
| 704 |

ADHESIVE COMPOSITION AND USE THEREOF

CROSS REFERENCE TO RELATED APPLICATIONS

The present application is a national stage entry under 35 U.S.C. § 371 of International Application No. PCT/KR2019/000949 filed on Jan. 23, 2019, which claims priority to Korean Patent Application No. 10-2018-0008029 filed on Jan. 23, 2018, the disclosure of which is incorporated herein by reference in its entirety.

TECHNICAL FIELD

The present application relates to a pressure-sensitive adhesive composition and a use thereof.

BACKGROUND ART

A polarizing plate may have a function of screening ultraviolet rays to protect a polarizer. As disclosed in Patent Document 1, the ultraviolet screening function can be included in a protective film for a polarizing plate, and can shield light having a wavelength region of about 380 nm or less for the purpose of protecting the polarizer.

As a method for implementing R, G and B colors by OLEDs, there is a method (WOLED method) of applying color filters to a white OLED light source or a method (RGB method) of configuring elements to emit R, G and B colors, respectively. The RGB method can be applied to a POLED (plastic OLED), which has a problem of having a short lifetime as compared to the WOLED method. The lifetime of the blue light source is relatively short in the RGB light sources, where the lifetime of the blue light source can be shortened by sunlight incident from the outside, for example, the light having the blue region of 380 nm or more. Therefore, in the polarizing plate applied to the POLED, a function of screening the light having the blue region of 380 nm or more is required for the purpose of protecting the blue light source of the POLED and extending the lifetime (Patent Document 1: Korean Patent Publication No. 10-1042477).

DISCLOSURE

Technical Problem

The present application provides a pressure-sensitive adhesive composition which has excellent performance to block ultraviolet rays including a blue region of 380 nm or more and is capable of exhibiting excellent durability upon reliability evaluation without deteriorating optical characteristics of a polarizing plate when applied to the polarizing plate, and a use thereof.

Technical Solution

The present application relates to a pressure-sensitive adhesive composition. The pressure-sensitive adhesive composition may comprise a pressure-sensitive adhesive resin and an ultraviolet absorber. The pressure-sensitive adhesive resin may be an acrylic polymer. The ultraviolet absorber may comprise a pyrazoline-based ultraviolet absorber and a malonic acid-based ultraviolet absorber. Hereinafter, the pressure-sensitive adhesive composition of the present application will be specifically described.

The acrylic polymer may comprise a polymerization unit of a (meth)acrylic acid ester monomer. As the (meth)acrylic acid ester monomer, an alkyl (meth)acrylate may be exemplified. For example, an alkyl (meth)acrylate having an alkyl group having 1 to 14 carbon atoms may be used in consideration of cohesion force, glass transition temperature and tackiness, and the like. Such a monomer may be exemplified by methyl (meth)acrylate, ethyl (meth)acrylate, n-propyl (meth)acrylate, isopropyl (meth)acrylate, n-butyl (meth)acrylate, t-butyl (meth)acrylate, sec-butyl (meth)acrylate, pentyl (meth)acrylate, 2-ethylhexyl (meth)acrylate, 2-ethylbutyl (meth)acrylate, n-octyl (meth)acrylate, isooctyl (meth)acrylate, isononyl (meth)acrylate, lauryl (meth)acrylate or tetradecyl (meth)acrylate, and the like.

The acrylic polymer may further comprise a polymerization unit of a copolymerizable monomer having a polar group. Here, the copolymerizable monomer having a polar functional group may mean a monomer capable of copolymerizing with another compound forming an acrylic polymer, such as a (meth)acrylic acid ester compound, and also capable of providing a polar functional group at the side chain or terminal of the polymer after copolymerization. Here, the polar functional group may be, for example, a functional group which can serve to realize crosslinked structures by reacting with a multifunctional crosslinking agent, which is described below, by application of heat or to improve wettability of a pressure-sensitive adhesive layer. The polar functional group may be exemplified by an acid group such as a hydroxyl group, a carboxyl group or an anhydride group thereof, a sulfonic acid group or a phosphoric acid group, a glycidyl group, an amino group or an isocyanate group, and the like.

The copolymerizable monomer having a polar group may be, for example, a copolymerizable monomer having a hydroxyl group. The copolymerizable monomer having a hydroxyl group may be a monomer which may simultaneously contain a moiety capable of copolymerizing with other monomers forming an acrylic polymer and a hydroxyl group to provide the hydroxyl group to the acrylic polymer after polymerization. Such a monomer may be exemplified by a hydroxyalkyl (meth)acrylate such as 2-hydroxyethyl (meth)acrylate, 2-hydroxypropyl (meth)acrylate, 4-hydroxybutyl (meth)acrylate, 6-hydroxyhexyl (meth)acrylate or 8-hydroxyoctyl (meth)acrylate, or a hydroxyalkylene glycol (meth)acrylate such as 2-hydroxyethylene glycol (meth)acrylate or 2-hydroxypropylene glycol (meth)acrylate, and the like, but is not limited thereto.

The acrylic polymer may comprise, for example, a polymerization unit derived from 70 parts by weight to 99.9 parts by weight of a (meth)acrylic acid ester monomer and 0.1 parts by weight to 30 parts by weight of a copolymerizable monomer having a polar group. In this specification, the term part by weight may mean a ratio of weight between components, unless otherwise specified.

The acrylic polymer may further comprise a polymerization unit derived from a known monomer, for example, a nitrogen-containing monomer such as (meth)acrylonitrile, (meth)acrylamide, N-methyl (meth)acrylamide, N-vinyl pyrrolidone, N-vinyl caprolactam or N-butoxymethyl (meth)acrylamide; a styrene-based monomer such as styrene or methylstyrene; glycidyl (meth)acrylate; or a carboxylic acid vinyl ester such as vinyl acetate, and the like. Such a polymerization unit may be contained, for example, in a ratio of 20 parts by weight or less relative to other polymerization units.

As the acrylic polymer, for example, a polymer having a weight average molecular weight (Mw) of 1,000,000 or more can be used. In this specification, the term weight average molecular weight is a conversion value relative to standard polystyrene measured by GPC (gel permeation chromatograph), and in this specification, "molecular weight" may mean "weight average molecular weight," unless otherwise specified. By setting the molecular weight of the polymer to 1,000,000 or more, the durability of the pressure-sensitive adhesive can be maintained in an appropriate range. The upper limit of the molecular weight is not particularly limited, which can be adjusted within a range of about 2,500,000 or less in consideration of, for example, coating properties and the like.

The acrylic polymer can be produced through a known polymerization method. For example, a monomer mixture obtained by appropriately blending a (meth)acrylic acid ester monomer and a polar group-containing copolymerizable monomer and/or other comonomers, and the like according to desired weight ratios can be applied to a usual polymerization method, such as solution polymerization, photo polymerization, bulk polymerization, suspension polymerization or emulsion polymerization, to produce the acrylic polymer. In the polymerization process, a polymerization initiator or a chain transfer agent and the like may also be used together, if necessary.

In this specification, the ultraviolet absorber may mean a compound which exhibits minimum transmittance at a wavelength region of ultraviolet rays, for example, 10 nm to 400 nm in a transmittance spectrum for wavelengths or exhibits maximum absorbance at a wavelength region of ultraviolet rays, for example, 10 nm to 400 nm in an absorbance spectrum for wavelengths. In the present specification, the maximum absorption wavelength of the ultraviolet absorber may mean a wavelength exhibiting the minimum transmittance or the maximum absorbance.

The ultraviolet absorber may comprise both a pyrazoline-based ultraviolet absorber and a malonic acid-based ultraviolet absorber. As the pressure-sensitive adhesive composition comprises two ultraviolet absorbers, such as a pyrazoline-based ultraviolet absorber and a malonic acid-based ultraviolet absorber, it has excellent performance in blocking ultraviolet rays including a blue region of 380 nm or more, where a pressure-sensitive adhesive composition can be provided, which exhibits excellent durability upon reliability evaluation without lowering optical characteristics of a polarizer when applied to the polarizer. It is difficult to match the color value of the polarizing plate when the pyrazoline-based ultraviolet absorber or the malonic acid-based ultraviolet absorber is solely formulated, whereas it is possible to exhibit the above-mentioned performance, since the color value change of the polarizing plate is not large while the light in the blue region is effectively blocked when the pyrazoline-based ultraviolet absorber and the malonic acid-based ultraviolet absorber are mixed and formulated.

The content of the ultraviolet absorber can be adjusted in consideration of the object of the present application. The pressure-sensitive adhesive composition may comprise 0.01 to 10 parts by weight of an ultraviolet absorber relative to 100 parts by weight of the acrylic polymer. The content of the ultraviolet absorber may mean the sum of the contents of the pyrazoline-based ultraviolet absorber and the malonic acid-based ultraviolet absorber. When the content ratio of the ultraviolet absorber is within the above range, it may be more advantageous to provide a pressure-sensitive adhesive composition which has excellent performance to block ultraviolet rays including the blue region, optical characteristics of the polarizing plate and durability upon reliability evaluation. When the content of the ultraviolet absorber is too high, a phenomenon, in which it affects the pressure-sensitive adhesive properties or crystallizes upon reliability evaluation, may occur. The content of the ultraviolet absorber may be specifically 0.01 parts by weight or more, 1 part by weight or more, 3 parts by weight or more, or 5 parts by weight or more, and may be 10 parts by weight or less, 8 parts by weight or less, 7 parts by weight or less, or 6.5 parts by weight.

The content ratio of the pyrazoline-based ultraviolet absorber and the malonic acid-based ultraviolet absorber can be adjusted in consideration of the object of the present application. In one example, the pressure-sensitive adhesive composition may comprise the malonic acid-based ultraviolet absorber in an amount equal to or greater than the content of the pyrazoline-based ultraviolet absorber. Within this ratio range, it may be advantageous to provide a pressure-sensitive adhesive composition which has excellent performance to block ultraviolet rays including a blue region, color characteristics of a polarizing plate and durability upon reliability evaluation.

The pressure-sensitive adhesive composition may comprise 0.01 to 5 parts by weight of a pyrazoline-based ultraviolet absorber and 1 to 10 parts by weight of a malonic acid-based ultraviolet absorber, relative to 100 parts by weight of the acrylic polymer. When the content ratios of the pyrazoline-based ultraviolet absorber and the malonic acid-based ultraviolet absorber are within the above ranges, it may be more advantageous to provide a pressure-sensitive adhesive composition which has excellent performance to block ultraviolet rays including a blue region, optical characteristics of a polarizing plate and durability upon reliability evaluation. The content of the pyrazoline-based ultraviolet absorber may be 0.01 parts by weight or more, 0.1 parts by weight or more, 0.25 parts by weight or more, or 0.5 parts by weight or more, and may be 5 parts by weight or less, 4 parts by weight or less, 3 parts by weight or less, or 2.5 parts by weight or less. The content of the malonic acid-based ultraviolet ray absorbent may be specifically 1 part by weight or more, 2 parts by weight or more, or 2.5 parts by weight or more, and may be 10 parts by weight or less, 8 parts by weight or less, or 6 parts by weight or less.

The maximum absorption wavelengths of the pyrazoline-based ultraviolet absorber and the malonic acid-based ultraviolet absorber may each be in a range of ultraviolet rays, for example, 10 nm to 400 nm. In one example, the maximum absorption wavelength of the pyrazoline-based ultraviolet absorber may be in the range of 380 nm to 390 nm, 385 nm to 390 nm, or 386 nm to 388 nm. In one example, the maximum absorption wavelength of the malonic acid-based ultraviolet absorber may be in the range of 380 nm to 390 nm, 382 nm to 386 nm, or 383 nm to 385 nm. When the maximum absorption wavelengths of the pyrazoline-based ultraviolet absorber and the malonic acid-based ultraviolet absorber are each within the above range, it may be more advantageous to provide a pressure-sensitive adhesive composition which has excellent performance to block ultraviolet rays including a blue region, optical characteristics of a polarizing plate and durability upon reliability evaluation.

As the pyrazoline-based ultraviolet absorber, a compound having a maximum absorption wavelength within the above range while containing a structure derived from pyrazoline can be used. The pyrazoline is a heterocyclic compound whose molecular formula is $C_3H_6N_2$.

In one example, the pyrazoline-based ultraviolet absorber may be a compound represented by the following formula 1.

[Formula 1]

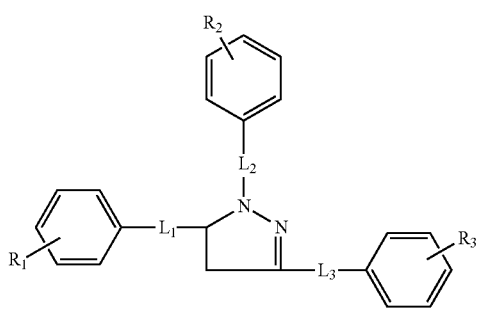

In Formula 1, $L_1$, $L_2$ and $L_3$ are each independently a single bond, an alkylene group, an alkenylene group, an alkynylene group, —COO— or —OCO—, and $R_1$, $R_2$ and $R_3$ are each independently hydrogen, hydrogen halide, halogen, an alkyl group, an alkenyl group, an alkynyl group, an alkoxy group, an alkoxycarbonyl group, a cyano group or a nitro group.

As the malonic acid-based ultraviolet absorber, a compound having a maximum absorption wavelength within the above range while containing a structure derived from malonic acid or propanedioic acid can be used. The malonic acid is a dicarboxylic acid having a structure of $CH_2(COOH)_2$.

In one example, the malonic acid-based ultraviolet absorber may be a compound represented by the following formula 2.

[Formula 2]

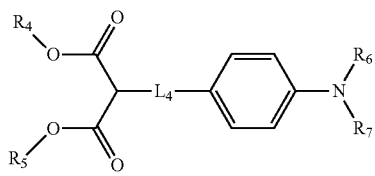

In Formula 2, $L_4$ is a single bond, an alkylene group, an alkenylene group, an alkynylene group, —COO— or —OCO—, and $R_4$, $R_5$, $R_6$ and $R_7$ are each independently hydrogen, hydrogen halide halogen, an alkyl group, an alkenyl group, an alkynyl group, an alkoxy group, an alkoxycarbonyl group, a cyano group or a nitro group.

In this specification, the halogen may be exemplified by chlorine, bromine or iodine, and the like.

In this specification, the alkyl group or alkylene group may be a linear or branched alkyl group or alkylidene group having 1 to 20 carbon atoms, 1 to 16 carbon atoms, 1 to 12 carbon atoms, 1 to 8 carbon atoms or 1 to 4 carbon atoms, or may mean a cyclo-alkyl group or alkylidene group having 3 to 20 carbon atoms, 3 to 16 carbon atoms or 4 to 12 carbon atoms, unless otherwise specified. The alkyl group or alkylene group may optionally be substituted by one or more substituents.

In this specification, the alkenyl group or alkenylene group may be a linear or branched alkenyl group or alkenylene group having 2 to 20 carbon atoms, 2 to 16 carbon atoms, 2 to 12 carbon atoms, 2 to 8 carbon atoms or 2 to 4 carbon atoms, or may mean a cyclo-alkenyl group or alkenylene group having 3 to 20 carbon atoms, 3 to 16 carbon atoms or 4 to 12 carbon atoms, unless otherwise specified.

The alkenyl group or alkenylene group may optionally be substituted by one or more substituents.

In this specification, the alkynyl group or alkynylene group may be a linear or branched alkynyl group or alkynylene group having 2 to 20 carbon atoms, 2 to 16 carbon atoms, 2 to 12 carbon atoms, 2 to 8 carbon atoms or 2 to 4 carbon atoms, or may mean a cyclo-alkynyl group or alkynylene group having 3 to 20 carbon atoms, 3 to 16 carbon atoms or 4 to 12 carbon atoms, unless otherwise specified. The alkynyl group or alkynylene group may be optionally substituted by one or more substituents.

In Formula 1 above, $L_1$ and $L_2$ may each be a single bond, and $L_3$ may be an alkenylene group, for example, an alkenylene group having 2 to 4 carbon atoms or 2 carbon atoms. The $L_3$ may be, for example, an alkenylene group containing one double bond. In Formula 1 above, $R_1$ and $R_3$ may each be an alkyl group, for example, an alkyl group having 1 to 8 carbon atoms or 1 to 4 carbon atoms, specifically 4 carbon atoms, and $R_2$ may be hydrogen.

In Formula 2 above, $L_4$ may be an alkenylene group, for example, an alkenylene group having 2 to 4 carbon atoms or 2 carbon atoms. The $L_4$ may be, for example, an alkenylene group containing one double bond. In Formula 2 above, $R_4$, $R_5$, $R_6$ and $R_7$ may each be an alkyl group, for example, an alkyl group having 1 to 4 carbon atoms or 1 to 2 carbon atoms, more specifically, a methyl group.

The pressure-sensitive adhesive composition may further comprise a crosslinking agent. The crosslinking agent may be a multifunctional crosslinking agent. The crosslinking agent may react with the polymer, for example, through heat application to implement a crosslinked structure.

As the crosslinking agent, for example, a crosslinking agent such as an isocyanate crosslinking agent, an epoxy crosslinking agent, an aziridine crosslinking agent and a metal chelate crosslinking agent may be used, without being limited thereto. The isocyanate crosslinking agent may be exemplified by a multifunctional isocyanate compound such as tolylene diisocyanate, xylene diisocyanate, diphenylmethane diisocyanate, hexamethylene diisocyanate, isophorone diisocyanate, tetramethylxylene diisocyanate, or a compound obtained by reacting the multifunctional isocyanate compound with a polyol compound such as trimethylolpropane, and the like; the epoxy crosslinking agent may be exemplified by one or more selected from the group consisting of ethylene glycol diglycidyl ether, triglycidyl ether, trimethylolpropane triglycidyl triglycidyl ether, N,N,N',N'-tetraglycidylethylenediamine and glycerin diglycidyl ether; and the aziridine crosslinking agent may be exemplified by one or more selected from the group consisting of N,N'-toluene-2,4-bis(1-aziridinecarboxamide), N,N'-diphenylmethane-4,4'-bis(1-aziridinecarboxamide), triethylene melamine, bisisophthaloyl-1-(2-methyl aziridine) and tri-1-aziridinylphosphine oxide, without being limited thereto. Also, the metal chelate crosslinking agent may be exemplified by a compound in which a polyvalent metal such as aluminum, iron, zinc, tin, titanium, antimony, magnesium and/or vanadium is coordinated to acetyl acetone or ethyl acetoacetate and the like, but is not limited thereto.

The crosslinking agent may be contained in the adhesive composition in a ratio of, for example, 0.01 parts by weight to 10 parts by weight or 0.01 parts by weight to 5 parts by weight relative to 100 parts by weight of the acrylic polymer. In this range, the cohesion force or durability of the pressure-sensitive adhesive can be excellently maintained.

In order to prevent yellowing or the like, in addition to the components, one or more additives selected from the group consisting of an antioxidant, a ultraviolet stabilizer, a heat stabilizer, a plasticizer, an antistatic agent, a filler, a defoaming agent, a surfactant, a nucleating agent, a flame retardant, a weathering stabilizer, a lubricant and a release agent may be further added to the pressure-sensitive adhesive composition in the extent that the object of the present invention can be achieved.

The pressure-sensitive adhesive composition may further comprise a solvent. The solvent may include aromatic hydrocarbons such as toluene, benzene and xylene; aliphatic hydrocarbons such as cyclohexane and decalin; esters such as ethyl acetate and butyl acetate; ketones such as acetone, methyl ethyl ketone and methyl isobutyl ketone; alcohols such as methanol, ethanol, isopropanol, butanol, isobutanol, methyl cellosolve, ethyl cellosolve and butyl cellosolve; ethers such as tetrahydrofuran and dioxane; halogenated hydrocarbons such as dichloromethane, chloroform and carbon tetrachloride; dimethylformamide; dimethyl sulfoxide and the like. These solvents may be used alone or in combination of two or more.

The present application also relates to a pressure-sensitive adhesive layer. The pressure-sensitive adhesive layer may be a layer of the pressure-sensitive adhesive composition. In this specification, the term "layer of a pressure-sensitive adhesive composition" may mean a layer formed by coating or curing a pressure-sensitive adhesive composition. In this specification, the term "curing of a pressure-sensitive adhesive composition" may mean implementing a crosslinked structure in the pressure-sensitive adhesive composition through physical or chemical action or reaction of components contained in the pressure-sensitive adhesive composition. In one example, the acrylic polymer in the pressure-sensitive adhesive layer may be present in a state crosslinked by the crosslinking agent. The curing can be induced by performing, for example, maintenance at room temperature, application of moisture, application of heat, irradiation of active energy rays, or two or more processes of the foregoing together. According to each case, the pressure-sensitive adhesive composition having the type that the curing is induced may be referred to as, for example, a room-temperature curing pressure-sensitive adhesive composition, a moisture curing pressure-sensitive adhesive composition, a thermosetting pressure-sensitive adhesive composition, an active energy ray curing pressure-sensitive adhesive composition or a mixed curing pressure-sensitive adhesive composition.

The present application also relates to a polarizing plate. The polarizing plate may comprise a polarizer and a pressure-sensitive adhesive layer. The pressure-sensitive adhesive layer may comprise a cured product of the pressure-sensitive adhesive composition.

In this specification, the term polarizer means a film, sheet or element having a polarization function. The polarizer is a functional element capable of extracting light that vibrates in one direction from incident light that vibrates in various directions.

The polarizer may be an absorbing polarizer. In this specification, the absorbing polarizer means an element exhibiting selective transmission and absorption characteristics with respect to incident light. The polarizer may be a linear polarizer. The absorbing polarizer may transmit light that vibrates in one direction from incident light that vibrates in various directions, and absorb light that vibrates in the other directions.

The polarizer may be a linear polarizer. In this specification, the linear polarizer means a polarizer, wherein the selectively transmitting light is linearly polarized light that vibrates in any one direction, and the selectively absorbing light is linearly polarized light that vibrates in a direction orthogonal to the vibration direction of the linearly polarized light.

As the polarizer, for example, a polarizer in which iodine is dyed on a polymer stretched film such as a PVA stretched film, or a guest-host polarizer in which liquid crystals polymerized in an oriented state are used as a host, and anisotropic dyes arranged in accordance with the orientation of the liquid crystals are used as a guest may be used, without being limited thereto.

According to one example of the present application, a PVA stretched film can be used as the polarizer. The transmittance and the polarization degree of the polarizer can be appropriately adjusted in consideration of the object of the present application. For example, the transmittance of the polarizer may be 42.5% to 55%, and the polarization degree may be 65% to 99.9997%.

The thickness of the pressure-sensitive adhesive layer can be appropriately adjusted in consideration of the object of the present application. The pressure-sensitive adhesive layer may have a thickness of, for example, 1 μm to 30 μm or so. The thickness of the pressure-sensitive adhesive layer may be specifically 1 μm or more, 3 μm or more, or 5 μm or more, and may be 25 μm or less, 20 μm or less, or 15 μm or less. Within such a thickness range, it may be advantageous to provide a pressure-sensitive adhesive composition having excellent performance to block ultraviolet rays including a blue region, color characteristics of a polarizing plate and durability upon reliability evaluation.

The pressure-sensitive adhesive layer may have excellent blocking properties against ultraviolet rays including a blue region of 380 nm or more. The pressure-sensitive adhesive layer may have, for example, transmittance of less than 3% for light having a wavelength range of 380 nm or more to 400 nm or less. The pressure-sensitive adhesive layer may have, for example, transmittance of less than 20% for light having a wavelength range of more than 400 nm to 410 nm or less. In this specification, the transmittance in a specific wavelength range may be transmittance for any one specific wavelength within the above range or transmittance for some wavelength range within the above range, or may mean transmittance for all wavelengths within the above range.

The polarizing plate may have excellent blocking properties against ultraviolet rays including a blue region of 380 nm or more. The polarizing plate may have, for example, transmittance of 0.6% or less for light having a wavelength of 380 nm or more to 400 nm or less. The polarizing plate may have, for example, transmittance of 5% or less for light having a wavelength of more than 400 nm to 410 nm or less. The polarizing plate may have, for example, transmittance of 1% or less, 0.5% or less, 0.1% or less, 0.05% or less, or 0.03% or less, for light having a wavelength of 380 nm. The polarizing plate may have, for example, transmittance of 1% or less, 0.5% or less, 0.2% or less, or 0.15% or less, for light having a wavelength of 390 nm. The polarizing plate may have, for example, transmittance of 1% or less, 0.8% or less, or 0.6% or less, for light having a wavelength of 400 nm. The polarizing plate may have, for example, transmittance of 10% or less, 8% or less, 6% or less, or 5% or less, for light having a wavelength of 410 nm.

The polarizing plate may have excellent color characteristics. For example, the polarizing plate may have, in an ab color coordinate system, a b value of 9.5 or less, 9 or less, 8.5 or less, 8.3 or less, or 8.1 or less. The ab color coordinate system may mean ab color coordinates of a color coordinate system known as Lab. The Lab coordinate system is a color coordinate system on the basis of C.I.E. (Commission Internaltion de L'Eclairage) chromaticity diagrams, which is a coordinate system for displaying colors based on a lightness element (L) and two color axes (ab). In the Lab coordinate system, the a axis is a two color axis of green and red, and the b axis is a two color axis of blue and yellow. The higher the b value, the more yellowish the polarizing plate, where if the b value is too high, the polarizing plate becomes too yellowish and thus visual appreciation of the entire product can also be problematic. The lower limit of the b value may be, for example, 5 or more, 5.5 or more, or 5.7 or more. The a value may be, for example, −5.0 to −3.0 or 4.0 to −3.0. The color value required for the polarizing plate can be appropriately adjusted in consideration of the kind of the product to which the polarizing plate is applied, the demand of the customer, etc., but in view of not causing a problem in visual appreciation of the product, for example, the b value of 4 to 8 or so may be appropriate. By mixing and formulating a pyrazoline-based ultraviolet absorber and a malonic acid-based ultraviolet absorber, the present application does not deviate greatly from the appropriate b value range of the polarizing plate while effectively blocking the light having a blue region, so that it may exhibit excellent optical characteristics.

The polarizing plate may have excellent durability. In one example, the polarizing plate may not cause lifting at a pressure-sensitive adhesive layer interface in high temperature reliability evaluation at a temperature of 80° C. or reliability evaluation to store it at a temperature of 60° C. and 90% relative humidity for 1000 hours.

The pressure-sensitive adhesive layer may directly contact the polarizer, or another layer may exist between the pressure-sensitive adhesive layer and the polarizer.

In one example, the polarizing plate may further comprise a retardation layer. The retardation layer may have a function of converting circularly polarized light into linearly polarized light or linearly polarized light into circularly polarized light. The retardation layer may have a quarter-wavelength phase retardation characteristic. The retardation layer may have an in-plane retardation value of 110 nm to 180 nm for light having a wavelength of 550 nm. In this specification, the in-plane retardation (Rin) is a value determined according to the following equation 1. The slow axis of the retardation layer may form about 40 degrees to 50 degrees, about 43 degrees to 47 degrees, and preferably about 45 degrees with the absorption axis of the polarizer. The retardation layer may be a polymer stretched film or a cured layer of a liquid crystal compound.

$$Rin=d\times(nx-ny) \quad (1)$$

In Equation 1, d is the thickness of the retardation layer, and nx, ny and nz denote the refractive indexes of the retardation layer in the x-axis, y-axis and z-axis directions, respectively. The x-axis means a direction parallel to the planar slow axis of the retardation layer, the y-axis means a direction parallel to the planar fast axis of the retardation layer, and the z-axis means the thickness direction of the retardation layer. The slow axis direction means a direction having the greatest refractive index on the plane, the fast axis direction means a direction orthogonal to the slow axis on the plane of the retardation layer, and the thickness direction means the normal direction of the plane formed by the slow axis and the fast axis. In this specification, the refractive index means a refractive index for light having a wavelength of about 550 nm, unless otherwise specified.

The retardation layer may have a reverse wavelength dispersion property. In this specification, the inverse wavelength dispersion property may mean a property satisfying the following equation 2.

$$Rin(450)<Rin(550) \quad (2)$$

In Equation 2, Rin (450) and R (550) are each the in-plane retardation for light having wavelengths of 450 nm and 550 nm.

When the polarizing plate comprises a retardation layer, the pressure-sensitive adhesive layer may exist between the polarizer and the retardation layer or on the outside of the retardation layer. In this specification, the outside of the retardation layer may mean a position on the opposite side of the polarizer side based on the retardation layer, which may include a position that directly contacts the retardation layer or a position that does not directly contact it. In this specification, the outside of the polarizer may mean a position on the opposite side of the retardation layer side based on the polarizer, which may include a position that directly contacts the polarizer or a position that does not directly contact it.

In one example, as shown in FIG. 1, the pressure-sensitive adhesive layer (30) may exist between the polarizer (10) and the retardation layer (20). In the polarizing plate according to the structure of FIG. 1, an intermediate layer to be described later, for example, the polarizer protective film, a retardation film other than the retardation layer, or a base film of the retardation film, and the like may also be included or may not be included, between the pressure-sensitive adhesive layer and the polarizer. According to this structure, it can protect a liquid crystal alignment film included in the polarizing plate from additional ultraviolet rays, thereby being advantageous. The liquid crystal alignment film may be used when a liquid crystal film (a cured layer of a liquid crystal compound) is used as the retardation layer.

The polarizing plate may further comprise an additional layer in addition to the retardation layer.

In one example, the polarizing plate may further comprise one or more layers of an upper layer existing outside the polarizer, a lower layer existing outside the retardation layer, and an intermediate layer existing between the polarizer and the retardation layer. The pressure-sensitive adhesive layer may be present at one or more of positions between the polarizer and the upper layer, between the polarizer and the intermediate layer, between the retardation layer and the intermediate layer, between the retardation layer and the lower layer, and outside the retardation layer.

As shown in FIG. 2, the upper layer (103) may be laminated on the opposite side of the polarizer (101) facing the retardation layer (102). In this case, the pressure-sensitive adhesive layer may be present at one or more of positions between the upper layer and the polarizer, between the polarizer and the retardation layer and/or outside the retardation layer.

As the type of the upper layer, a protective film of a polarizer, a hard coating layer, a retardation film other than the retardation layer, an antireflective layer or a liquid crystal coating layer, and the like can be exemplified, without being limited thereto. The specific type of each constitution used as the upper layer is not particularly limited, and for example, various kinds of films used for constituting an optical film such as a polarizing plate in the industry can be used without limitation. The upper layer may be a single layer of the illustrated layers or may have a multi-layer structure comprising the laminated structure of two or more layers in the illustrated layers.

As shown in FIG. 3, the lower layer (203) may be laminated on the opposite side of the surface of the retardation layer (202) facing the polarizer (201). In this case, the pressure-sensitive adhesive layer may be present at one or more of positions between the lower layer and the retardation layer, between the polarizer and the retardation layer, and outside the retardation layer. In the case of FIG. 3, an upper layer as shown in FIG. 2 may be added. For example, as shown in FIG. 3, an upper layer such as a hard coating layer or a low reflection layer may be present on the outer side of the polarizer in the state where the lower layer exists, and a protective film may also be present on one side or both sides of the polarizer.

As the type of the lower layer, a pressure-sensitive adhesive layer or an adhesive layer for attaching a retardation film other than the retardation layer, or the polarizing plate to another element, an adhesive layer, or a protective film or release film for protecting the pressure-sensitive adhesive layer or the adhesive layer can be exemplified. In this case, the pressure-sensitive adhesive layer as the lower layer may also be the above-described pressure-sensitive adhesive layer of the present application. The lower layer may be a single layer of the illustrated layers or may have a multi-layer structure comprising the laminated structure of two or more layers in the illustrated layers.

As shown in FIG. 4, the intermediate layer (303) may exist between the polarizer (301) and the retardation layer (302). In this case, the pressure-sensitive adhesive layer may be present at one or more of positions between the intermediate layer and the polarizer, between the intermediate layer and the retardation layer, and outside the retardation layer. Although not shown in the structure of FIG. 4, the upper layer in the structure of FIG. 2 and/or the lower layer in the structure of FIG. 3 may also be present.

As the intermediate layer, the above-mentioned polarizer protective film, a retardation film other than the retardation layer, or a base film of the retardation layer can be exemplified. The intermediate layer may be a single layer of the illustrated layers or may have a multi-layered structure comprising the laminated structure of two or more layers in the illustrated layers.

As the protective film of the polarizer or the base film of the retardation layer, for example, a cellulose film such as a TAC (triacetyl cellulose) film; a polyester film such as a PET (poly(ethylene terephthalate)) film; a polycarbonate film; a polyethersulfone film; an acrylic film and/or a polyolefin-based film such as a polyethylene film, a polypropylene film, a polyolefin film containing a cyclo or norbornene structure or an ethylene-propylene copolymer film, and the like can be used, without being limited thereto.

As the retardation film other than the retardation layer, a retardation film having a positive thickness direction retardation value may be exemplified. In this specification, the thickness direction retardation (Rth) may be a value determined according to the following equation 3. When the polarizing plate further comprises a retardation film having a positive thickness direction retardation value, it may have excellent antireflection characteristics and color characteristics at a viewing angle. As the retardation film, a retardation film satisfying the following equation 4 or 5 can be used. The retardation film satisfying the following equation 4 can be called a +C plate, and the retardation film satisfying the following equation 5 can be called a +B plate. Such a retardation film can be exemplified by a polymer stretched film, a vertically oriented liquid crystal layer, a splay oriented liquid crystal layer or a tilt oriented liquid crystal layer, and the like, but is not limited thereto. In one example, the projection of the optical axis (slow axis) of the retardation film onto a plane may be parallel or orthogonal to the absorption axis of the polarizer.

$$Rth = d \times (nz - ny) \tag{3}$$

$$nx = ny < nz \tag{4}$$

$$nx > ny \text{ and } nz > ny \tag{5}$$

In Equation 3, d is the thickness of the retardation layer, and in Equations 3 to 5, nx, ny and nz are each as defined above.

FIGS. 5 and 6 each illustratively show a structure of a polarizing plate according to one example of the present application. The polarizing plate according to FIG. 5 may comprise a hard coating layer (403), a polarizer (401), a polarizer protective film (404), a first pressure-sensitive adhesive layer (405), a retardation layer base film (406), a retardation layer (402), a +C plate (407) and a second pressure-sensitive adhesive layer (408) sequentially. The pressure-sensitive adhesive layer of the present invention as described above can be used as the first pressure-sensitive adhesive layer and/or the second pressure-sensitive adhesive layer, and for example, can be used as the first pressure-sensitive adhesive layer. The polarizing plate according to FIG. 6 may comprise a hard coating layer (403), a polarizer (401), a first pressure-sensitive adhesive layer (405), a retardation layer base film (406), a retardation layer (402), a +C plate (407) and a second pressure-sensitive adhesive layer (408) sequentially. The pressure-sensitive adhesive layer of the present invention as described above can be used as the first pressure-sensitive adhesive layer and/or the second pressure-sensitive adhesive layer, and for example, can be used as the first pressure-sensitive adhesive layer.

The present application relates to an organic light emitting device. The organic light emitting device may include a polarizing plate and an organic light emitting panel. When the polarizing plate comprises a retardation layer, the retardation layer may be disposed to be adjacent to the organic light emitting panel as compared to the polarizer.

FIG. 7 illustratively shows a structure of the organic light emitting device of the present application. As shown in FIG. 7, the organic light emitting device may comprise a substrate (701), and a first electrode layer (702), an organic light emitting layer (703) and a second electrode layer (704), which are sequentially provided on the first surface of the substrate, and may comprise the polarizing plate (100) provided on the second surface of the substrate.

As the substrate, a plastic substrate can be used. The organic light emitting device comprising the plastic substrate may be advantageous in the implementation of a rollable, flexible or bendable organic light emitting device.

The plastic substrate may comprise a polymer. The polymer may be exemplified by polyimide, polyamic acid, polyethylene naphthalate, polyether ether ketone, polycarbonate, polyethylene terephthalate, polyether sulfide, polysulfone or an acrylic polymer, and the like. In one example, in terms of process temperatures, the plastic substrate may comprise polyimide with excellent high-temperature durability.

As the substrate, a translucent substrate can be used. The translucent substrate may have, for example, transmittance of 50% or more, 60% or more, 70% or more, or 80% for light in the visible light region.

One of the first electrode layer and the second electrode layer may be an anode and the other may be a cathode. The anode is an electrode to which holes are injected, which may be made of a conductive material having a high work function, and the cathode is an electrode to which electrons are injected, which may be made of a conductive material having a low work function. In one example, the first electrode layer may be an anode and the second electrode layer may be a cathode. In one example, the anode may be a transparent electrode, and the cathode may be a reflective electrode. The anode may comprise a transparent metal oxide, for example, ITO, IZO, AZO, GZO, ATO or $SnO_2$, and the like. The cathode may comprise a metal, for example, Ag, Au, Al or the like.

The organic light emitting layer may comprise an organic material capable of emitting light when power has been applied to the first electrode layer and the second electrode layer. In a structure referred to as a so-called bottom emitting device, the first electrode layer may be formed of a transparent electrode layer, and the second electrode layer may be formed of a reflective electrode layer. Also, in a structure referred to as a so-called top emitting device, the first electrode layer is formed of a reflective electrode layer, and the second electrode layer is formed of a transparent electrode layer. Electrons and holes injected by the electrode layers may be recombined in the organic light emitting layer to generate light. The light can be emitted toward the substrate in the bottom emitting device and toward the second electrode layer in the top emitting device.

The organic emitting layer may comprise a red emitting layer, a green emitting layer and a blue emitting layer. The emitting layers may comprise known organic materials that emit red, green and blue, respectively. In one example, the organic light emitting device may be driven by a method (RGB method) that three primary color light emitting layers form one pixel (dot, picture element) while emitting different colors, respectively, or may be driven by a method (WOLED method) that one pixel is formed by laminating the three primary color light emitting layers so as to emit white and then various colors are implemented by disposing a color filter layer on the top of the white light emitting layer.

The organic light emitting panel may further comprise sub-layers between the first electrode layer and the organic light emitting layer and between the second electrode layer and the organic light emitting layer. The sub-layer may include a hole transporting layer, a hole injecting layer, an electron injecting layer, and an electron transporting layer for balancing electrons and holes, but is not limited thereto.

The organic light emitting display panel may further comprise an encapsulation substrate. The encapsulation substrate may be present on the second electrode layer. The encapsulation substrate may be made of glass, a metal and/or a polymer, and may encapsulate the first electrode layer, the organic light emitting layer and the second electrode layer to prevent moisture and/or oxygen from being introduced from the outside.

The polarizing plate may be disposed on a side where light is emitted from the organic light emitting device. For example, in the case of a bottom emission structure in which light is emitted toward the substrate, it may be disposed outside the substrate, and in the case of a top emission structure in which light is emitted toward the encapsulation substrate, it may be disposed outside the encapsulation substrate. The polarizing plate can improve the visibility of the organic light emitting device by preventing external light from being reflected by a reflective layer made of a metal, such as electrodes and wiring of the organic light emitting device, and coming out of the organic light emitting device.

Advantageous Effects

The present application can provide a pressure-sensitive adhesive composition which has excellent performance to block ultraviolet rays including a blue region of 380 nm or more and exhibits excellent durability upon reliability evaluation without deteriorating the optical characteristics of a polarizing plate when applied to the polarizing plate. The pressure-sensitive adhesive composition can be used, for example, for a polarizing plate and an organic light emitting device.

BRIEF DESCRIPTION OF DRAWINGS

FIGS. 1 to 6 illustratively show structures of polarizing plates.

FIG. 7 illustratively shows a structure of an organic light emitting device.

MODE FOR INVENTION

Figure 1:
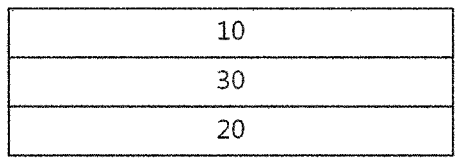
Figure 2:
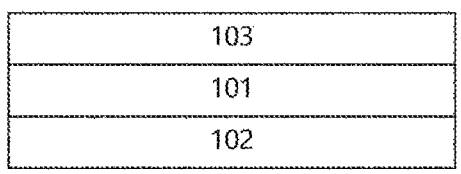
Figure 3:
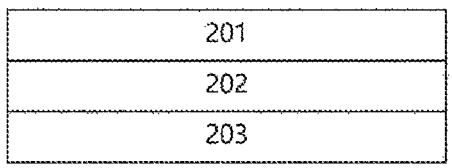
Figure 4:
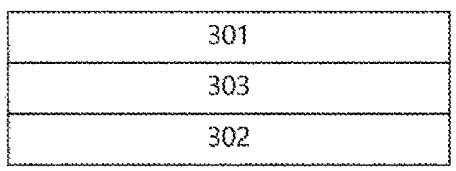
Figure 5:
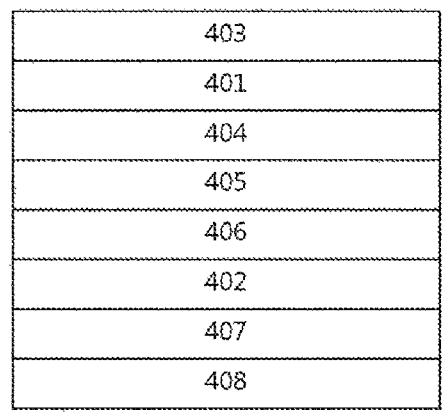

Hereinafter, the present application will be specifically described by way of examples, but the scope of the present application is not limited by the following examples.

Example 1

Preparation of Pressure-Sensitive Adhesive Composition

To a 1 L reactor with refluxing nitrogen gas and equipped with a cooling device so as to easily adjust a temperature, 99 parts by weight of n-butyl acrylate (n-BA) and 1 part by weight of 2-hydroxybutylacrylate (2-HBA) were introduced. Subsequently, 180 parts by weight of ethyl acetate (EAc) as a solvent was introduced to the reactor and for oxygen removal, nitrogen gas was purged for 60 minutes. Thereafter, the temperature was maintained at 67° C., and 0.05 parts by weight of AIBN (azobisisobutyronitrile) as a reaction initiator was introduced thereto, followed by reaction for 8 hours. After the reaction, the reactant was diluted with ethyl acetate to prepare an acrylic polymer having a solid content concentration of 30 wt % and a weight average molecular weight of 1,000,000.

A pressure-sensitive adhesive composition was prepared by formulating, relative to 100 parts by weight of the acrylic polymer prepared above, 0.5 parts by weight of an ultraviolet absorber (UV390, manufactured by Eutec, maximum absorption wavelength: 387 nm) of the following formula A, 6 parts by weight of an ultraviolet absorber (UV1990, manufactured by Eutec, maximum absorption wavelength: 384 nm) of the following formula B, and a crosslinking agent (XDI-based isocyanate, T-39M manufactured by Mitsuichemicals) and a silane coupling agent (T-789J, manufactured by Shinetsu) in a solvent so as to have a solid content concentration of 30 wt %.

[Formula A]

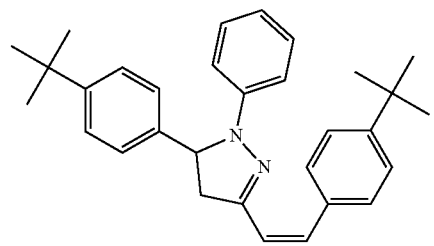

-continued

[Formula B]

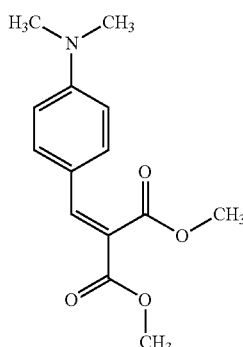

Production of Pressure-Sensitive Adhesive Layer

The above-prepared pressure-sensitive adhesive composition was coated on a release-treated surface of a release-treated PET (poly(ethylene terephthalate)) film (thickness: 38 μm, MRF-38, manufactured by Mitsubishi) to have a predetermined thickness after drying, and heat-cured in an oven at 80° C. for 3 minutes to produce a pressure-sensitive adhesive layer.

Production of Polarizing Plate

A polyvinyl alcohol-based resin film was stretched, dyed with iodine, and then treated with an aqueous solution of boric acid to prepare a polarizer. Subsequently, a TAC (triacetyl cellulose) film having a thickness of 60 μm was attached to one side of the polarizer with an aqueous polyvinyl alcohol-based adhesive. Subsequently, on the side of the polyvinyl alcohol polarizer to which the TAC film was not attached, one side of the above-produced pressure-sensitive adhesive layer was laminated using the same aqueous polyvinyl alcohol-based adhesive as above to produce a polarizing plate.

Example 2

A pressure-sensitive adhesive composition, a pressure-sensitive adhesive layer and a polarizing plate were prepared in the same manner as in Example 1, except that in Example 1, the content of the ultraviolet absorber of Formula A was changed to 2.5 parts by weight and the content of the ultraviolet absorber of Formula B was changed to 2.5 parts by weight.

Example 3

A pressure-sensitive adhesive composition, a pressure-sensitive adhesive layer and a polarizing plate were prepared in the same manner as in Example 1, except that in Example 1, the content of the ultraviolet absorber of Formula A was changed to 2 parts by weight and the content of the ultraviolet absorber of Formula B was changed to 4 parts by weight.

Example 4

A pressure-sensitive adhesive composition, a pressure-sensitive adhesive layer and a polarizing plate were prepared in the same manner as in Example 1, except that in Example 1, the content of the ultraviolet absorber of Formula A was changed to 1 part by weight and the content of the ultraviolet absorber of Formula B was changed to 4.5 parts by weight.

Example 5

A pressure-sensitive adhesive composition, a pressure-sensitive adhesive layer and a polarizing plate were prepared in the same manner as in Example 1, except that in Example 1, the content of the ultraviolet absorber of Formula A was changed to 1 part by weight and the content of the ultraviolet absorber of Formula B was changed to 5 parts by weight.

Example 6

A pressure-sensitive adhesive composition, a pressure-sensitive adhesive layer and a polarizing plate were prepared in the same manner as in Example 1, except that in Example 1, the content of the ultraviolet absorber of Formula A was changed to 0.75 parts by weight and the content of the ultraviolet absorber of Formula B was changed to 4.5 parts by weight.

Example 7

A pressure-sensitive adhesive composition, a pressure-sensitive adhesive layer and a polarizing plate were prepared in the same manner as in Example 1, except that in Example 1, the content of the ultraviolet absorber of Formula A was changed to 0.5 parts by weight and the content of the ultraviolet absorber of Formula B was changed to 5 parts by weight.

Comparative Example 1

A pressure-sensitive adhesive composition, a pressure-sensitive adhesive layer and a polarizing plate were prepared in the same manner as in Example 1, except that in Example 1, the ultraviolet absorber was not used.

Comparative Example 2

A pressure-sensitive adhesive composition, a pressure-sensitive adhesive layer and a polarizing plate were prepared in the same manner as in Example 1, except that in Example 1, 2 parts by weight of a cyanoacetate-based ultraviolet absorber (UV1995, manufactured by Eutec) of the following formula C was used instead of the ultraviolet absorbers of Formulas A and B.

[Formula C]

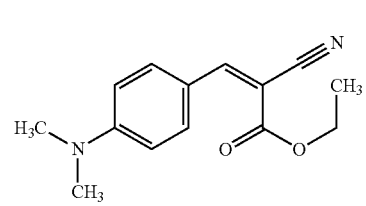

Comparative Example 3

A pressure-sensitive adhesive composition, a pressure-sensitive adhesive layer and a polarizing plate were prepared in the same manner as in Example 1, except that in Example 1, the ultraviolet absorber of Formula B was not used and only the ultraviolet absorber of Formula A was used in an amount of 6 parts by weight.

Comparative Example 4

A pressure-sensitive adhesive composition, a pressure-sensitive adhesive layer and a polarizing plate were prepared in the same manner as in Example 1, except that in Example 1, the ultraviolet absorber of Formula A was not used and only the ultraviolet absorber of Formula B was used in an amount of 5 parts by weight.

Evaluation Example 1 Optical Property Evaluation of Polarizing Plate

The polarizing plates prepared in Examples and Comparative Examples were cut to a size of 25 mm×25 mm (width×length) to prepare specimens. The ultraviolet blocking performance including the blue region was evaluated by measuring the transmittance of the polarizing plate using an ultraviolet-visible light spectrometer (V-7100, manufactured by JASCO), and the results were described in Table 1. The light transmittance in Table 1 below represents the percentage of the light transmission amount when the total light transmittance is set to 100. From Table 1 below, it can be confirmed that Examples 1 to 7 have excellent ultraviolet blocking properties while exhibiting low transmittance for light having a wavelength of 380 nm to 410 nm.

Evaluation Example 2 Color Characteristic Evaluation of Polarizing Plate

The polarizing plates prepared in Examples and Comparative Examples were cut to a size of 25 mm×25 mm (width×length) to prepare specimens. The visual appreciation characteristics of the polarizing plate were evaluated by measuring the ab color value of the polarizing plate using an ultraviolet-visible light spectrometer (V-7100, manufactured by JASCO), and the results were described in Table 1. In the ab color values of the polarizing plates of Table 1 below, particularly, the change in the b values is not large, and thus it can be confirmed that they have excellent visual appreciation characteristics.

Evaluation Example 3 Durability Evaluation Under Reliability Conditions

Specimens prepared by cutting the polarizing plates prepared in Examples and Comparative Examples to a size of 90 mm×170 mm (width×length) were prepared by two sheets for each of Examples and Comparative Examples. Subsequently, the two specimens as prepared were attached to both sides of a glass substrate (110 mm×190 mm×0.7 mm=width×length×thickness) so that the optical absorption axes of the respective polarizing plates were crossed to prepare a sample. The pressure applied at the time of attachment was about 5 Kg/cm$^2$, and the work was performed in a clean room so that bubbles or foreign matters did not occur at the interfaces. The prepared sample was placed in a reliability chamber and allowed to stand for 1,000 hours under the conditions of a temperature of 60° C. and 90% relative humidity, and then the occurrence of lifting at the pressure-sensitive adhesive layer interface was observed. The durability evaluation criteria are as follows.

Durability Evaluation Criteria

◉: No lifting occurred
O: Minor lifting occurred
Δ: Lifting occurred
X: Large lifting occurred

TABLE 1

|  |  | Optical characteristics of polarizing plate | | | | Color value of polarizing plate | | |
|---|---|---|---|---|---|---|---|---|
|  |  | 380 nm | 390 nm | 400 nm | 410 nm | a | b | Durability |
| Example | 1 | 0.00358 | 0.01171 | 0.15074 | 3.1851 | −3.35665 | 6.08694 | ◉ |
|  | 2 | 0.02986 | 0.14338 | 0.58414 | 2.33351 | −4.34249 | 8.08324 | ◉ |
|  | 3 | 0.01272 | 0.06608 | 0.34834 | 2.35764 | −4.08566 | 7.63464 | ◉ |
|  | 4 | 0.00751 | 0.037 | 0.40226 | 4.05252 | −3.40537 | 6.29248 | ◉ |
|  | 5 | 0.00655 | 0.02802 | 0.22552 | 2.87648 | −3.6515 | 6.73121 | ◉ |
|  | 6 | 0.00625 | 0.03072 | 0.45386 | 4.78265 | −3.20868 | 6.0652 | ◉ |
|  | 7 | 0.00385 | 0.01902 | 0.38017 | 4.9589 | −3.08869 | 5.76821 | ◉ |
| Comparative | 1 | 0.03677 | 3.917145 | 24.57123 | 36.53365 | −1.02422 | 2.37472 | ◉ |
| Example | 2 | 0.0311 | 0.20836 | 0.24104 | 0.13361 | −12.8472 | 23.49686 | ◉ |
|  | 3 | 0.19821 | 0.816465 | 1.866805 | 2.580715 | −5.42873 | 9.80389 | ◉ |
|  | 4 | 0.00191 | 0.01172 | 0.77493 | 8.52572 | −2.40393 | 4.7132 | ◉ |

EXPLANATION OF REFERENCE NUMERALS

10: polarizer, 20: retardation layer, 30: pressure-sensitive adhesive layer
101, 201, 301, 401: polarizer, 102, 202, 302, 402: retardation layer,
103: upper layer, 203: lower layer, 303: intermediate layer
403: hard coating layer, 404: polarizer protective film, 405: first pressure-sensitive adhesive layer, 406: retardation layer base film, 407: +C plate, 408: second pressure-sensitive adhesive layer
100: polarizing plate, 701: substrate, 702: first electrode layer, 703: organic light emitting layer, 704: second electrode layer

The invention claimed is:

1. A pressure-sensitive adhesive composition comprising an acrylic polymer and an ultraviolet absorber, wherein the ultraviolet absorber comprises a pyrazoline-based ultraviolet absorber and a malonic acid-based ultraviolet absorber,
wherein the pyrazoline-based ultraviolet absorber is a compound represented by the following formula 1:

[Formula 1]

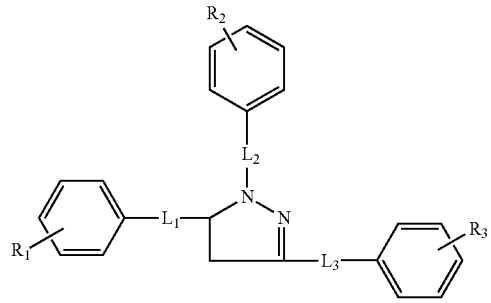

wherein, $L_1$, $L_2$ and $L_3$ are each independently a single bond, an alkylene group, an alkenylene group, an alkynylene group, —COO— or —OCO—, and $R_1$, $R_2$ and $R_3$ are each independently hydrogen, halogen, an alkyl group, an alkenyl group, an alkynyl group, an alkoxy group, an alkoxycarbonyl group, a cyano group or a nitro group, wherein the malonic acid-based ultraviolet absorber is a compound represented by the following formula 2:

[Formula 2]

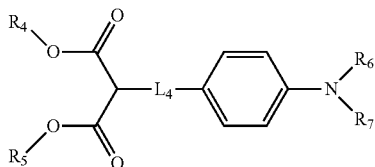

wherein, $L_4$ is a single bond, an alkylene group, an alkenylene group, an alkynylene group, —COO— or —OCO—, and $R_4$, $R_5$, $R_6$ and $R_7$ are each independently hydrogen, halogen, an alkyl group, an alkenyl group, an alkynyl group, an alkoxy group, an alkoxycarbonyl group, a cyano group or a nitro group, wherein the ultraviolet absorber is included in an amount of 0.01 to 10 parts by weight relative to 100 parts by weight of the acrylic polymer, wherein the pyrazoline-based ultraviolet absorber is included in an amount of 0.01 to 5 parts by weight and the malonic acid-based ultraviolet absorber is included in an amount of 1 to 10 parts by weight, relative to 100 parts by weight of the acrylic polymer.

2. The pressure-sensitive adhesive composition according to claim 1, wherein the acrylic polymer comprises a polymerization unit of a (meth)acrylic acid ester monomer.

3. The pressure-sensitive adhesive composition according to claim 2, wherein the acrylic polymer further comprises a polymerization unit of a copolymerizable monomer having a polar group.

4. The pressure-sensitive adhesive composition according to claim 1, wherein the maximum absorption wavelength of the pyrazoline-based ultraviolet absorber is in a range of 380 nm to 390 nm.

5. The pressure-sensitive adhesive composition according to claim 1, wherein the maximum absorption wavelength of the malonic acid-based ultraviolet absorber is in a range of 380 nm to 390 nm.

6. The pressure-sensitive adhesive composition according to claim 1, comprising a multifunctional crosslinking agent.

7. A polarizing plate comprising a polarizer and a pressure-sensitive adhesive layer, wherein the pressure-sensitive adhesive layer comprises a cured product of the pressure-sensitive adhesive composition of claim 1.

8. The polarizing plate according to claim 7, wherein the pressure-sensitive adhesive layer has a thickness of 1 μm to 30 μm.

9. The polarizing plate according to claim 7, wherein the polarizing plate has transmittance of 0.6% or less for light having a wavelength of 380 nm or more to 400 nm or less, and transmittance of 5% or less for light having a wavelength of more than 400 nm to 410 nm or less.

10. The polarizing plate according to claim 7, wherein the polarizing plate has a b value of 9.5 or less in ab color coordinates.

11. The polarizing plate according to claim 7, wherein the polarizing plate does not cause lifting at the pressure-sensitive adhesive layer interface upon reliability evaluation that the polarizing plate is stored at a temperature of 60 .degree. C. and 90% relative humidity for 1000 hours.

12. The polarizing plate according to claim 7, further comprising a retardation layer having a quarter-wavelength phase retardation characteristic.

13. The polarizing plate according to claim 12, wherein the pressure-sensitive adhesive layer is present between the polarizer and the retardation layer.

14. The polarizing plate according to claim 12, further comprising an upper layer existing on an opposite side of the polarizer facing the retardation layer, a lower layer on an opposite side of the retardation layer facing the polarizer, an intermediate layer between the polarizer and the retardation layer, or a combination thereof, and the pressure-sensitive adhesive layer between the polarizer and the upper layer, between the polarizer and the intermediate layer, between the retardation layer and the intermediate layer or between the retardation layer and the lower layer.

15. An organic light emitting device comprising an organic light emitting panel and the polarizing plate of claim 7.

16. The organic light emitting device according to claim 15, wherein the organic light emitting panel comprises a plastic substrate, and a first electrode layer, an organic light emitting layer and a second electrode layer, which are sequentially provided on a first surface of the plastic substrate, and the polarizing plate is provided on a second surface of the plastic substrate.

* * * * *